US011322332B2

(12) United States Patent
Kato et al.

(10) Patent No.: US 11,322,332 B2
(45) Date of Patent: May 3, 2022

(54) APPARATUS AND METHOD FOR MEASURING ENERGY SPECTRUM OF BACKSCATTERED ELECTRONS

(71) Applicant: TASMIT, INC., Yokohama (JP)

(72) Inventors: Makoto Kato, Yokohama (JP); Sumio Sasaki, Yokohama (JP); Yukihiro Tanaka, Yokohama (JP); Yuichiro Yamazaki, Yokohama (JP)

(73) Assignee: Tasmit, Inc., Yokohama (JP)

( * ) Notice: Subject to any disclaimer, the term of this patent is extended or adjusted under 35 U.S.C. 154(b) by 0 days.

(21) Appl. No.: 16/977,808

(22) PCT Filed: Mar. 1, 2019

(86) PCT No.: PCT/JP2019/008066
§ 371 (c)(1),
(2) Date: Sep. 2, 2020

(87) PCT Pub. No.: WO2019/172115
PCT Pub. Date: Sep. 12, 2019

(65) Prior Publication Data
US 2021/0012999 A1 Jan. 14, 2021

(30) Foreign Application Priority Data
Mar. 6, 2018 (JP) .............................. JP2018-039636

(51) Int. Cl.
*H01J 37/244* (2006.01)
*H01J 37/28* (2006.01)

(52) U.S. Cl.
CPC ............ *H01J 37/244* (2013.01); *H01J 37/28* (2013.01); *H01J 2237/049* (2013.01);
(Continued)

(58) Field of Classification Search
CPC .... H01J 37/244; H01J 37/28; H01J 2237/049; H01J 2237/15; H01J 2237/1532;
(Continued)

(56) References Cited

U.S. PATENT DOCUMENTS 5,422,486 A 6/1995 Herrmann et al.
6,455,848 B1 9/2002 Krijn et al.
(Continued)

FOREIGN PATENT DOCUMENTS

JP 2018006339 A 1/2018

OTHER PUBLICATIONS

International Patent Application No. PCT/JP2019/008066; International Search Report and Written Opinion dated Mar. 26, 2019, 7 pgs.

*Primary Examiner* — David A Vanore
(74) *Attorney, Agent, or Firm* — Lathrop GPM LLP

(57) ABSTRACT

The present invention relates to an apparatus and method for analyzing the energy of backscattered electrons generated from a specimen. The apparatus includes: an electron beam source (101) for generating a primary electron beam; an electron optical system (102, 105, 112) configured to direct the primary electron beam to a specimen while focusing and deflecting the primary electron beam; and an energy analyzing system configured to detect an energy spectrum of backscattered electrons emitted from the specimen. The energy analyzing system includes: a Wien filter (108) configured to disperse the backscattered electrons; a detector (107) configured to measure the energy spectrum of the backscattered electrons dispersed by the Wien filter (108); and an operation controller (150) configured to change an intensity of a quadrupole field of the Wien filter (108), while moving a detecting position of the detector (107) for the
(Continued)

backscattered electrons in synchronization with the change in the intensity of the quadrupole field.

11 Claims, 7 Drawing Sheets

(52) U.S. Cl.
CPC ... *H01J 2237/15* (2013.01); *H01J 2237/1532* (2013.01); *H01J 2237/2446* (2013.01); *H01J 2237/24475* (2013.01); *H01J 2237/24485* (2013.01)

(58) Field of Classification Search
CPC ..... H01J 2237/2446; H01J 2237/24475; H01J 2237/24485; H01J 2237/057; H01J 37/05; H01J 37/09; H01J 37/29; G01N 23/20
See application file for complete search history.

(56) References Cited

U.S. PATENT DOCUMENTS

| | | | |
|---|---|---|---|
| 7,205,542 B1* | 4/2007 | Mankos | H01J 37/228 250/306 |
| 7,592,586 B2* | 9/2009 | Watanabe | G01N 23/225 250/251 |
| 10,103,002 B1* | 10/2018 | Gamm | H01J 37/222 |
| 10,614,999 B2* | 4/2020 | Nakazawa | H01J 37/28 |
| 10,802,073 B2* | 10/2020 | Shimoda | G01R 31/307 |
| 2005/0263701 A1* | 12/2005 | Nagahama | H01J 37/26 250/310 |
| 2006/0076489 A1 | 4/2006 | Ohshima et al. | |
| 2010/0059672 A1* | 3/2010 | Zeile | H01J 37/3056 250/282 |
| 2013/0292568 A1* | 11/2013 | Bizen | H01J 37/244 250/307 |
| 2018/0005797 A1* | 1/2018 | Kato | H01J 37/222 |

* cited by examiner

APPARATUS AND METHOD FOR MEASURING ENERGY SPECTRUM OF BACKSCATTERED ELECTRONS

CROSS-REFERENCE TO RELATED APPLICATIONS

This application is a 35 U.S.C. § 371 filing of International Application No. PCT/JP2019/008066 filed Mar. 1, 2019, which claims the benefit of priority to Japanese Patent Application No. 2018-039636 filed Mar. 6, 2018, each of which is incorporated herein by reference in its entirety.

TECHNICAL FIELD

The present invention relates to an apparatus and a method for analyzing the energy of backscattered electrons generated from a specimen.

BACKGROUND ART

A scanning electron microscope for the purpose of observing semiconductor devices has been developed. With a trend toward finer and finer device patterns to be observed, multilayered structure of patterns is progressing. Under such circumstances, it is effective for the scanning electron microscope to use a high acceleration voltage capable of generating a high penetration force and to observe backscattered electrons having appropriate energies determined depending on a depth from a surface of a specimen which is an object of the observation. For this purpose, it is necessary for the scanning electron microscope to have a function of measuring the energy spectrum of backscattered electrons.

In a conventional technique, in order to analyze the energy of the backscattered electrons, a Wien filter is used to deflect the backscattered electrons slightly from an optical axis to direct the backscattered electrons to an energy analyzer, such as an electrostatic spherical analyzer or a magnetic-field sector analyzer, by which the energy is analyzed. The Wien filter used for this purpose acts as a beam separator for separating the primary electron beam traveling toward a specimen and the backscattered electrons returning from the specimen. Alternatively, a single Wien filter may simultaneously operate as a beam separator and an energy analyzer by using an energy dispersion action of the Wien filter itself. Use of a Wien filter as a beam separator is disclosed in, for example, Patent Document 1. A technique of combining a Wien filter and an energy analyzer is disclosed in Patent Document 2, for example. In addition, a technique using only a Wien filter for energy analysis is disclosed in Patent Document 3, for example.

CITATION LIST

Patent Literature

Patent document 1: U.S. Pat. No. 5,422,486
Patent document 2: U.S. Pat. No. 6,455,848
Patent document 3: U.S. Patent Application Publication No. US 2006/0076489

SUMMARY OF INVENTION

Technical Problem

In formation of a backscattered electron image with selected energy, an energy value to be selected depends on the purpose of observation of a target specimen. Therefore, as an initial step, an energy spectrum of the backscattered electrons in the widest possible range is measured, so that an energy range that is effective for characterizing the specimen is roughly determined. Next, a spectrum near the determined energy value is investigated in detail, and a backscattered electron image is finally formed with only a selected energy value. In this procedure, a shorter measuring time is prioritized over an energy resolution when initially analyzing the wide energy range. Therefore, parallel detection, which can acquire a spectrum over a wide energy range in a short time, is desirable, rather than serial detection performed by a general analyzer which acquires a spectrum by sweeping a pass energy. On the other hand, when a spectrum is to be measured in detail near a specific energy value, the energy resolution is prioritized. In this case, the serial detection may be used, but ideally the parallel detection is desired. When a backscattered electron image is to be obtained finally with only selected specific energy, high energy resolution is still required.

The electrostatic spherical analyzer is an energy analyzer generally used for analyzing the energy of the back-scattered electrons. This type of analyzer has a high energy resolution, but has a strictly limited range of energy that can be detected at a time, because this type of analyzer is configured to detect, at its outlet side, only electrons which have passed through a narrow space between electrodes. In particular, when the energy of the back-scattered electrons to be analyzed is as high as several tens keV, the interval between the electrodes should be narrow in order to avoid electric discharge caused by an increase in voltage applied to the electrodes. As a result, the energy range that can achieve a simultaneous detection becomes narrower. Due to this situation, the electrostatic spherical analyzer necessarily adopts the serial detection in which a detector is fixed in one place to sweep the pass energy. Therefore, the electrostatic spherical analyzer is not suitable for use in measuring a wide energy range in a short time.

In the case of using the Wien filter alone for the energy analysis, the Wien filter can parallel-detect a wide energy range, if the Wien filter has a modified shape and has a modified shape of an electromagnetic field shunt of the accompanying it. However, high energy resolution cannot be obtained for all energy values in that energy range. The reason for this is that the beam at each energy dispersed by the Wien filter is not focused on a detection surface perpendicular to the optical axis and is therefore greatly blurred. Accordingly, although the Wien filter is suitable for the purpose of performing the parallel detection with low energy resolution, it cannot realize high energy resolution.

An object of the present invention is to provide an apparatus and a method capable of achieving high energy resolution in a wide energy range.

Solution to Problem

In an embodiment, there is provided an apparatus comprising: an electron beam source configured to generate a primary electron beam; an electron optical system configured to direct the primary electron beam to a specimen while focusing and deflecting the primary electron beam; and an energy analyzing system configured to detect an energy spectrum of backscattered electrons emitted from the specimen, the energy analyzing system including: a Wien filter configured to disperse the backscattered electrons; a detector configured to measure the energy spectrum of the backscattered electrons dispersed by the Wien filter; and an operation controller configured to change an intensity of a quadrupole field of the Wien filter, while moving a detecting position of the detector for the backscattered electrons in synchronization with the change in the intensity of the quadrupole field.

In an embodiment, the operation controller is configured to change the intensity of the quadrupole field of the Wien filter, while moving the detecting position of the detector for the backscattered electrons in synchronization with the change in the intensity of the quadrupole field such that the backscattered electrons are focused on the detecting position.

In an embodiment, the energy analyzing system further includes an astigmatism correcting device arranged between the electron beam source and the Wien filter, the astigmatism correcting device being configured to cancel astigmatism of the primary electron beam in synchronization with the change in the intensity of the quadrupole field.

In an embodiment, the energy analyzing system further includes a shunt arranged at an outlet side of the Wien filter, the shunt having a slit extending in a direction in which the backscattered electrons are dispersed.

In an embodiment, there is provided an apparatus comprising: an electron beam source configured to generate a primary electron beam; an electron optical system configured to direct the primary electron beam to a specimen while focusing and deflecting the primary electron beam; and an energy analyzing system configured to detect an energy spectrum of backscattered electrons emitted from the specimen, the energy analyzing system including: a Wien filter configured to disperse the backscattered electrons; and a detector configured to measure the energy spectrum of the backscattered electrons dispersed by the Wien filter, the detector having a detection surface that substantially coincides with focal positions at respective energies of the backscattered electrons dispersed by the Wien filter.

In an embodiment, the detection surface of the detector comprises a curved surface or a flat surface.

In an embodiment, the energy analyzing system further includes an astigmatism correcting device arranged between the electron beam source and In an embodiment, the energy analyzing system further includes a shunt arranged at an outlet side of the Wien filter, the shunt having a slit extending in a direction in which the backscattered electrons are dispersed.

In an embodiment, there is provided a method comprising: directing a primary electron beam, generated by an electron beam source, to a specimen; dispersing backscattered electrons, emitted from the specimen, by a Wien filter; measuring an energy spectrum of the dispersed backscattered electrons by a detector; and during measuring of the energy spectrum, changing an intensity of a quadrupole field of the Wien filter, while moving a detecting position of the detector for the backscattered electrons in synchronization with the change in the intensity of the quadrupole field.

In an embodiment, changing the intensity of quadrupole field of the Wien filter, while moving the detecting position of the detector for the backscattered electrons in synchronization with the change in the intensity of the quadrupole field comprises, during measuring of the energy spectrum, changing the intensity of the quadrupole field of the Wien filter, while moving the detecting position of the detector for the backscattered electrons in synchronization with the change in the intensity of the quadrupole field such that the backscattered electrons are focused on the detecting position.

In an embodiment, the method further comprises cancelling astigmatism of the primary electron beam in synchronization with the change in the intensity of the quadrupole field.

In an embodiment, there is provided a method comprising: directing a primary electron beam, generated by an electron beam source, to a specimen; dispersing backscattered electrons, emitted from the specimen, by a Wien filter; and measuring an energy spectrum of the dispersed backscattered electrons by a detector, the detector having a detection surface that substantially coincides with focal positions at respective energies of the backscattered electrons dispersed by the Wien filter.

In an embodiment, the detection surface of the detector comprises a curved surface or a flat surface.

Advantageous Effects of Invention

According to the present invention, the high energy resolution can be realized over a wide energy range.

DESCRIPTION OF EMBODIMENTS

Hereinafter, embodiments of the present invention will be described in detail with reference to the drawings.

Figure 1:
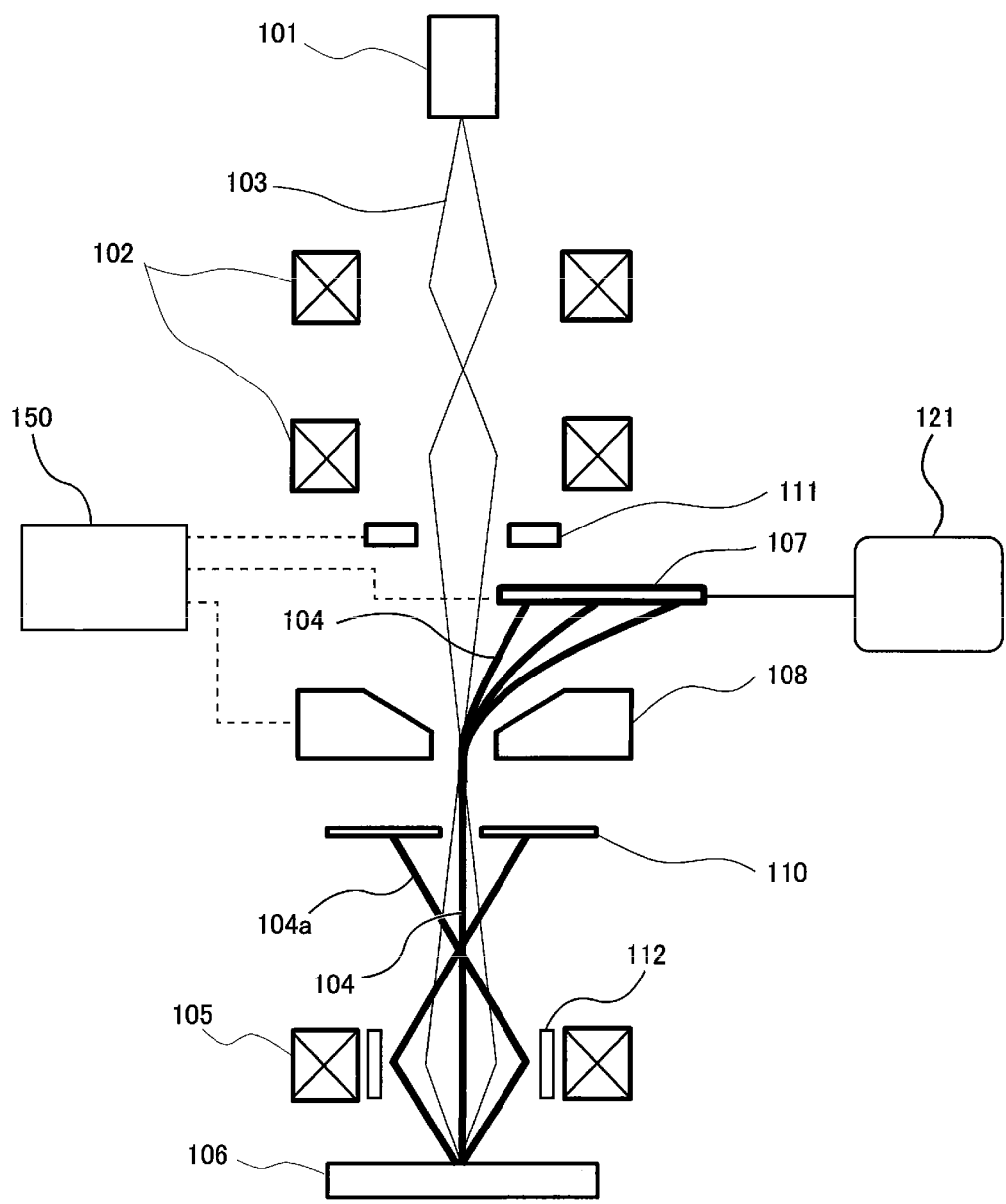
FIG. 1 is a schematic diagram showing an embodiment of a scanning electron microscope.

FIG. 1 is a schematic diagram showing an embodiment of a scanning electron microscope. The scanning electron microscope shown in FIG. 1 is applicable to an apparatus for analyzing energy of backscattered electrons emitted from a specimen 106. In FIG. 1, an electron gun 101, serving as an electron beam source, generates a primary electron beam 103, which is firstly converged by a condenser lens system 102 composed of multiple lenses. The primary electron beam 103 passes through a Wien filter 108 and is focused by an objective lens 105 onto the specimen 106. The primary electron beam 103 is deflected by a deflector 112 so as to scan a surface of the specimen 106.

Generally, angles of a backscattered electron beam, generated in the specimen 106, with respect to an optical axis are distributed widely. The backscattered electrons, emitted from the specimen 106, are restricted by a backscattered electron diaphragm 110, so that the backscattered electrons are separated into backscattered electrons 104 that can pass through an aperture of the backscattered electron diaphragm 110 and backscattered electrons 104a that are excluded. This aperture of the backscattered electron diaphragm 110 serves as a light source as viewed from an energy analyzing system. The backscattered electron beam 104 that has passed through the backscattered electron diaphragm 110 is deflected by the Wien filter 108 in accordance with energies, and is directed to a detector 107. The backscattered electron beam 104 is detected by the detector 107, and an energy spectrum of the backscattered electrons is measured by the detector 107. An imaging device 121, which is coupled to the detector 107, selects an energy range that characterizes the specimen 106 from this energy spectrum, and forms an image using only output signal of the detector 107 within the selected energy range. This image is a target backscattered electron image.

The Wien filter 108 and the detector 107 are coupled to an operation controller 150, so that operations of the Wien filter 108 and the detector 107 are controlled by the operation controller 150. The operation controller 150 includes a general-purpose computer or a dedicated computer including a CPU (Central Processing Unit) and a memory.

The operation of the Wien filter 108 in the scanning electron microscope will be described below. First, an electric field and a magnetic field are produced so as to exert forces on the incident direction of the primary electron beam in opposite directions so that the forces are cancelled mutually. A condition of intensities of the electric field and the magnetic field in this state is called Wien condition, which is expressed as $E_1 = vB_1$. $E_1$ represents a uniform component of the electric field in an x direction produced by the Wien filter 108, and has a $\cos\theta$ dependence with respect to an angle of direction $\theta$. $B_1$ represents a uniform component of the magnetic field in a y direction, and has a $\sin\theta$ dependence with respect to an angle of direction $\theta$. When electrons having a velocity v enter the Wien filter 108, the electrons travel straight as they are, if the electric field and the magnetic field satisfy the Wien condition. When the electrons enter the Wien filter 108 along the beam axis from the opposite direction under the Wien condition, the electric field and the magnetic field exert forces on the electrons in the same direction, because the direction of force from the magnetic field is reversed. As a result, the Wien filter 108 acts as a deflector. In this manner, the Wien filter 108 can deflect, from the optical axis, the electron beam that is traveling in the opposite direction from the primary electrons, without affecting the primary electrons.

When the Wien filter 108 forms a uniform electric field and a uniform magnetic field, the primary electron beam is slightly subjected to a focusing lens action in the x direction, while there is no focusing lens action in the y direction. Thus, the primary electron beam is subjected to the same action as an action on the primary electron beam when passing through a lens having astigmatism. In order to cancel this effect, a quadrupole-field component is superimposed on either or both of the uniform electric field and the uniform magnetic field. Generally, the quadrupole field exerts different lens actions in the x direction and the y direction. Therefore, adjusting intensity of the quadrupole field can provide a lens action which is symmetric in the x direction and the y direction (i.e., axisymmetric) in the entirety of the Wien filter 108. Such a lens action does not exert astigmatism on the primary electron beam. This condition is called stigmatic condition. The quadrupole field that can satisfy this condition has an $E_2$ component having $\cos 2\theta$ dependence in a case where the quadrupole field is produced by the electric field, or has a $B_2$ component having $\sin 2\theta$ dependence in a case where the quadrupole field is produced by the magnetic field. Alternatively, the quadrupole field may have the $E_2$ component and the $B_2$ component which are superimposed.

Next, the structure of the Wien filter 108 will be described. Generally, a Wien filter that satisfies the stigmatic condition is required to have both components of a uniform field and the quadrupole field. For this reason, many Wien filters are of a multipole lens type with an electromagnetic-field superposition structure. The minimum structure of the multipole lens type is a quadrupole structure, which, however, cannot produce an ideal uniform field and may produce a large amount of excess multipole components, resulting in the aberration of the primary electron beam. In view of these circumstances, the Wien filter 108 has a structure having more poles, e.g., an octapole structure.

Figure 2:
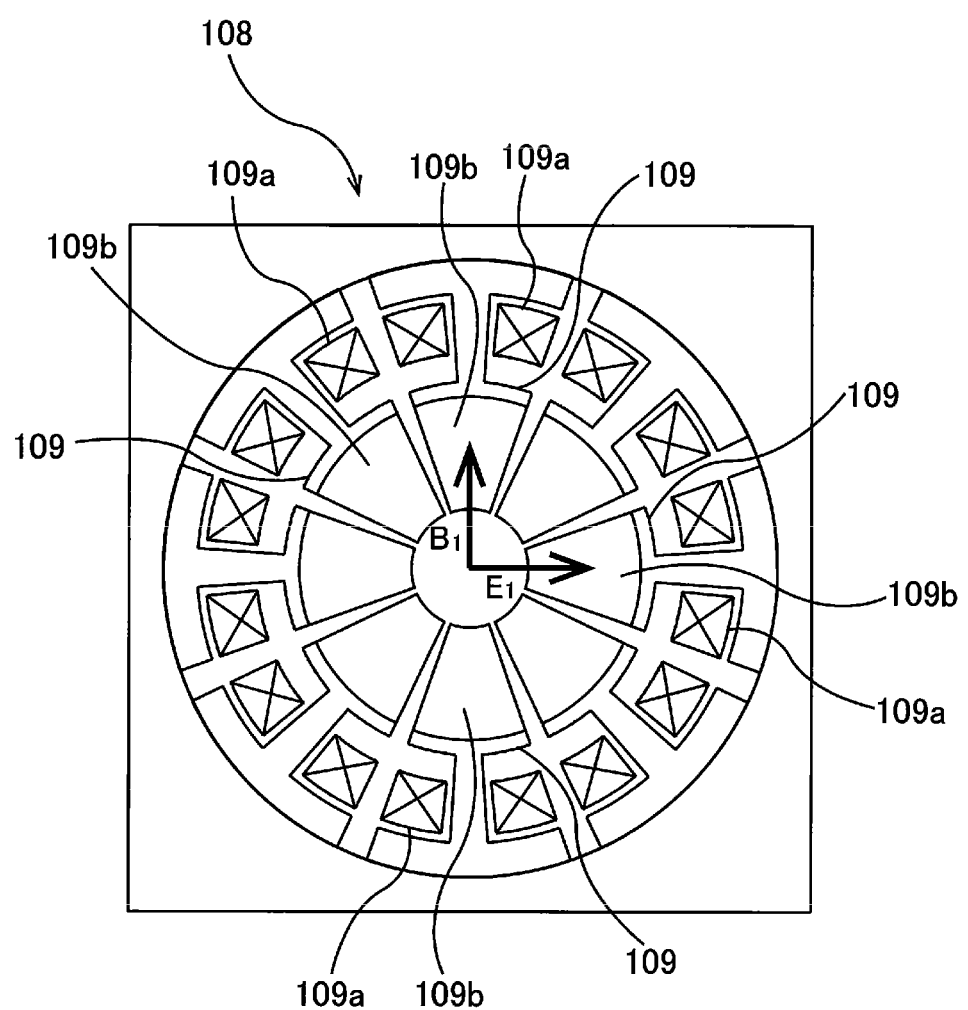
FIG. 2 is a schematic diagram showing an embodiment of an octapole structure of a Wien filter.

FIG. 2 is a schematic diagram showing an embodiment of an octapole structure of the Wien filter 108, and shows a top view of the Wien filter 108 as seen from a direction perpendicular to the beam axis. Eight poles 109 are arranged around a central axis of the Wien filter 108 at regular intervals. These poles 109 include coils 109*a*, respectively. Voltages Vn and excitations ATn (n=1,2, . . . , 8) are applied to the poles 109, respectively, to thereby produce a uniform field that satisfies the Wien condition and produce the quadrupole field for the stigmatic condition. All of the poles 109 work as electrodes and magnetic poles, and are therefore made of magnetic material, such as permalloy.

In a conventional technique, a Wien filter, serving as a beam separator, has a small deflection angle, typically about 10 degrees. In this embodiment, the Wien filter 108 has electromagnetic poles each having a modified shape. Specifically, each of the electromagnetic poles has a tapered shape at an outlet side (or upper side) of the Wien filter at which the backscattered electrons exit. This tapered shape can allow the Wien filter to achieve a large deflection angle, and can therefore enable simultaneous measurement in a wide energy range.

Figure 3:
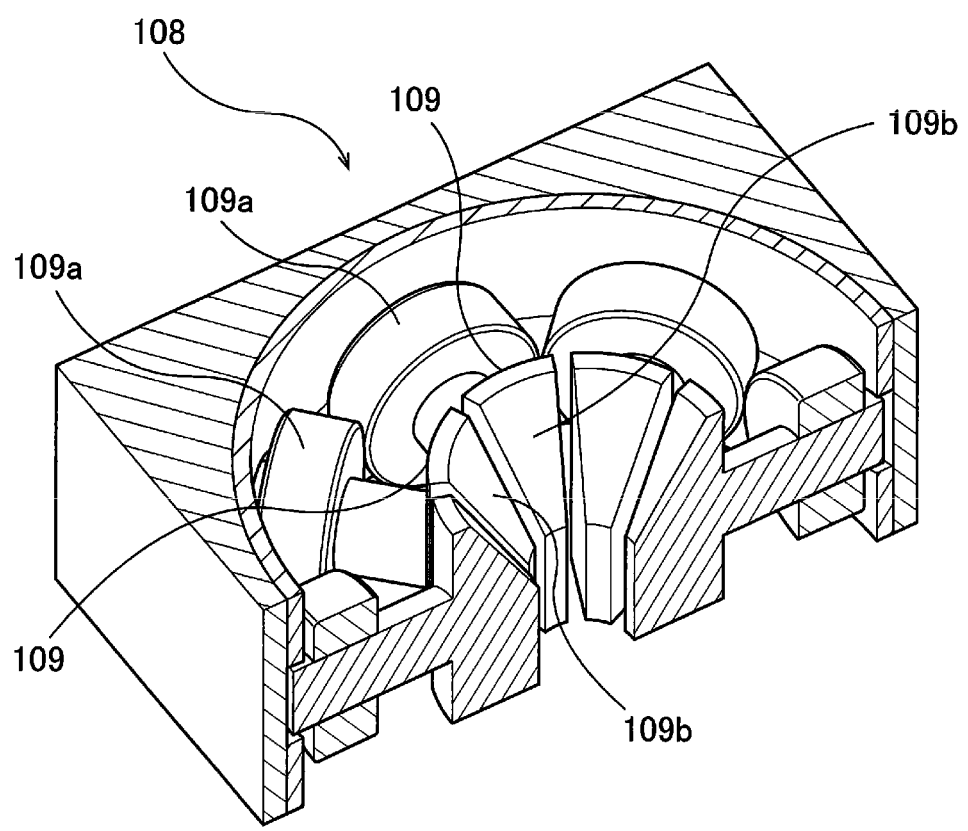
FIG. 3 is a cross-sectional perspective view of the Wien filter.

FIG. 3 is a cross-sectional perspective view of the Wien filter 108. Each of the poles 109 has a center-side end which has an upper surface constituted by a tapered surface 109*b* inclined downwardly toward the central axis of the Wien filter 108. The tapered surfaces 109*b* of the eight poles 109 are arranged around the central axis of the Wien filter 108 at regular intervals, thus forming a surface in a shape of truncated cone facing upward. The backscattered electrons 104, emitted from the specimen 106, enter the Wien filter 108 from below, and pass out of the Wien filter 108 through its exit constituted by the tapered surfaces 109*b*.

With the multi-pole structure of the Wien filter 108 as described above, the distribution of the electromagnetic field may greatly expand in a fringe region, and the electric field and the magnetic field may be affected separately by structures existing around the Wien filter 108. This effect is particularly large on the outlet side of the Wien filter 108 having the tapered structure. If this effect causes a difference in distribution between the electric field and the magnetic field, the Wien condition may not be satisfied in the fringe region, even if the Wien condition is satisfied near the center of the Wien filter 108. As a result, the primary electron beam may be deflected.

Figure 4:
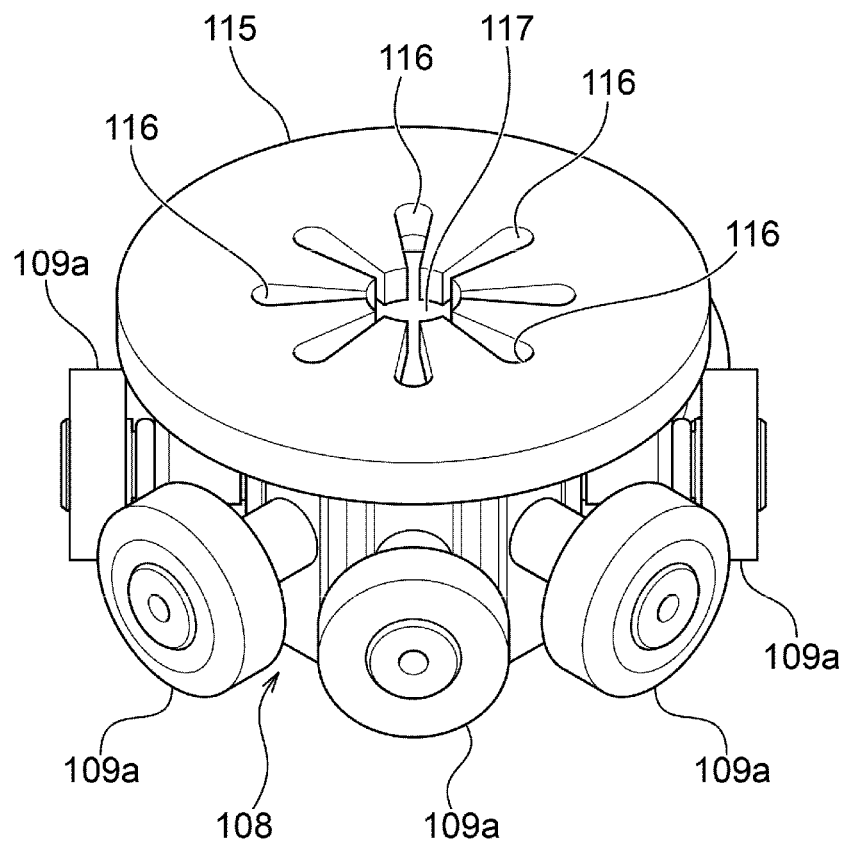
FIG. 4 is a perspective view showing a shunt arranged at an outlet side of the Wien filter.

Conventionally, in order to prevent this effect, an electromagnetic-field shunts are arranged at an inlet and an outlet of a Wien filter to forcibly attenuate the electromagnetic field. In this embodiment, in order to largely deflect the backscattered electrons, a shunt 115 having slits 116 is arranged at the outlet side of the Wien filter 108 as shown in FIG. 4. Although one slit 116 may be provided only in the direction in which the backscattered electrons are dispersed, it is ideal to arrange the slits 116 in all directions of eight poles in order to maintain the symmetry of the electromagnetic field. The slits 116 extend radially and have the same shape or a similar shape. The slits 116 are located around a through-hole 117 formed in the center of the shunt 115, and an inner open end of each slit 116 is connected to the through-hole 117. One of the slits 116 extends from the through-hole 117 in the direction in which the backscattered electrons 104 are dispersed (deflected). The diameter of the through-hole 117 of the shunt 115 is smaller than the diameter of the outlet of the Wien filter 108 constituted by the tapered surfaces 109b. The shunt 115 having such configurations can damp the fringe field and allows the detector 107 to simultaneously measure a wide energy range. The shunt 115 is made of a magnetic material having a potential of zero, for example, permalloy. In the present embodiment, the shunt 115 has the plurality of radially extending slits 116, while in one embodiment, the shunt 115 may have only one slit 116 extending from the through-hole 117 in the direction in which the backscattered electrons 104 are dispersed (deflected).

Figure 5:
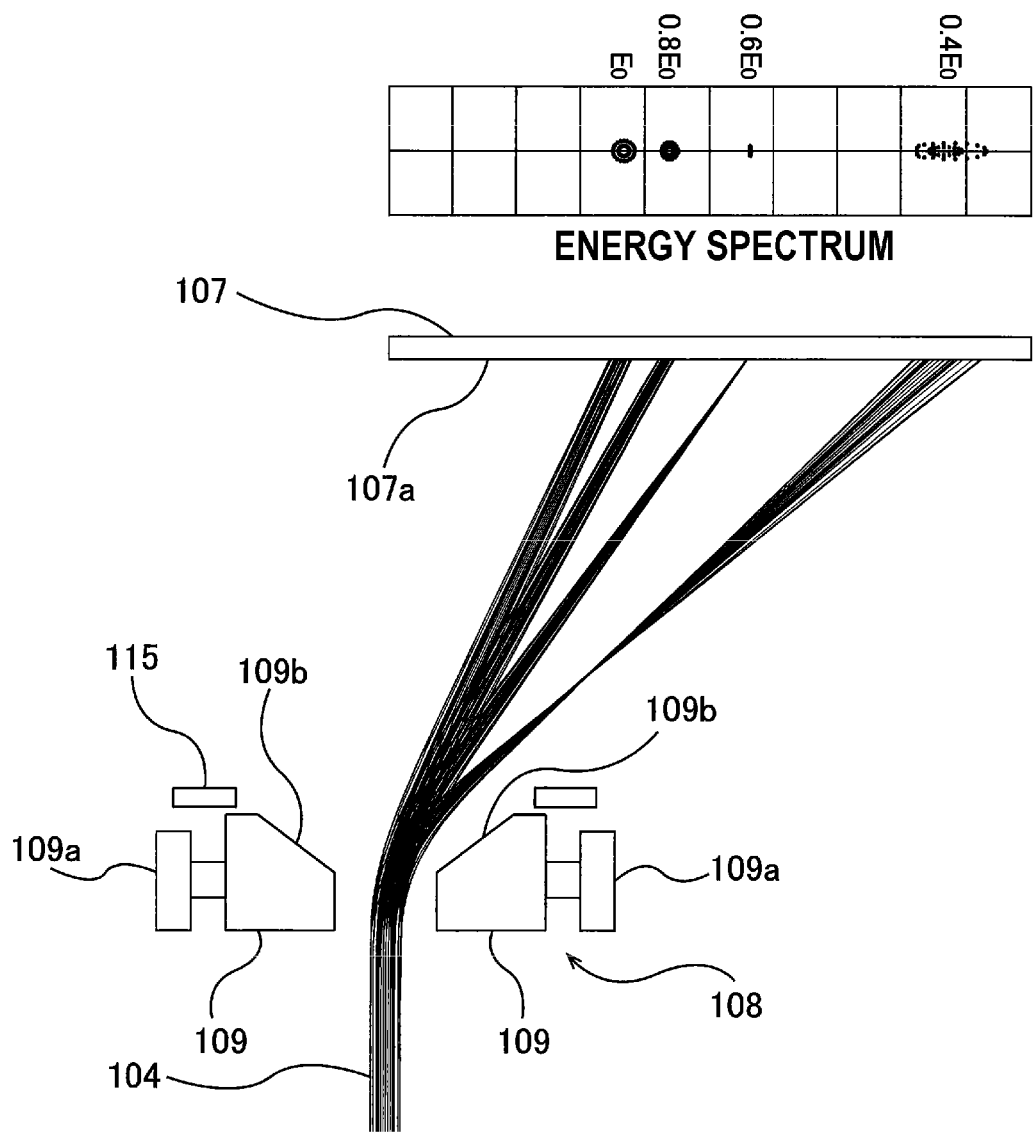
FIG. 5 is a diagram showing an example of a simulation result of an operation of the Wien filter.

FIG. 5 is a diagram showing a simulation result of the operation of the Wien filter 108 in this embodiment. Generally, a scanning area of the primary electron beam on the specimen surface is very narrow. Therefore, an area at which the backscattered electron beam 104 is generated may be regarded as a point electron source. In this simulation, it is assumed that the backscattered electron beam 104 becomes a parallel beam after it has passed through the backscattered electron diaphragm 110. The smaller the diameter of the backscattered electron diaphragm 110, the more the energy resolution is improved. However, at the same time, the sensitivity is lowered. Therefore, the diameter of the backscattered electron diaphragm 110 should be determined based on the finally required resolution and sensitivity. In the simulation shown in FIG. 5, the diameter of the backscattering electron diaphragm 110 is assumed to be considerably larger than the actual diameter in order to make it easier to see the beam focusing state at each energy. The voltages and the excitations for the poles 109 of the Wien filter 108 are set so as to satisfy the Wien condition and the stigmatic condition simultaneously.

The backscattered electrons 104 that have passed through the backscattered electron diaphragm 110 are deflected by the Wien filter 108 at different angles depending on the energies of the backscattered electrons, and as a result, the backscattered electrons are dispersed. The dispersed backscattered electrons enter the detector 107, which measures the energy spectrum of the backscattered electrons. Where $E_0$ represents the energy of the primary electron beam, the energies of the backscattered electrons are generally distributed from 0 to $E_0$ continuously. The simulation of FIG. 5 shows an orbital calculation result in which the energies of the backscattered electrons range from $E_0$ to $0.4E_0$ in increment of $0.2E_0$. The detector 107 can measure an area with an energy width of $0.6E_0$ ranging from $E_0$ to $0.4E_0$ at one time. The area that can be measured at one time can be adjusted by the uniform field intensity of the Wien filter 108. Specifically, changing the uniform components $E_1$ and $B_1$ of the electric field and the magnetic field while satisfying the Wien condition makes it possible to change the dispersion action of the backscattered electrons while maintaining the balance condition for the primary electron beam. For example, by lowering the dispersion action of the Wien filter 108, the detector 107 can measure all areas from $E_0$ to 0 at one time. However, the energy resolution decreases as the measurable area is expanded. Therefore, when the area to be observed is specified in advance to some extent, it is advantageous to narrow the energy range.

With regard to the energy resolution in FIG. 5, backscattered electrons having energy of $0.6E_0$ are line-focused on a detection surface 107a of the detector 107 in a direction perpendicular to the energy dispersion direction. However, backscattered electrons having other energies spread in the energy dispersion direction, and the energy resolution is lowered by this amount. In this manner, generally, of backscattered electrons dispersed by the deflecting action of the Wien filter 108, only the backscattered electrons having a certain specific energy are focused on the detection surface 107a of the detector 107. This situation is not desirable in terms of energy resolution, but it is suitable for the purpose of parallel detection of a wide energy range in a short time. As described above, the diameter of the backscattered electron diaphragm 110 is assumed to be large in FIG. 5, and reducing this diameter makes it possible to improve energy resolution at the expense of sensitivity.

Figure 6:
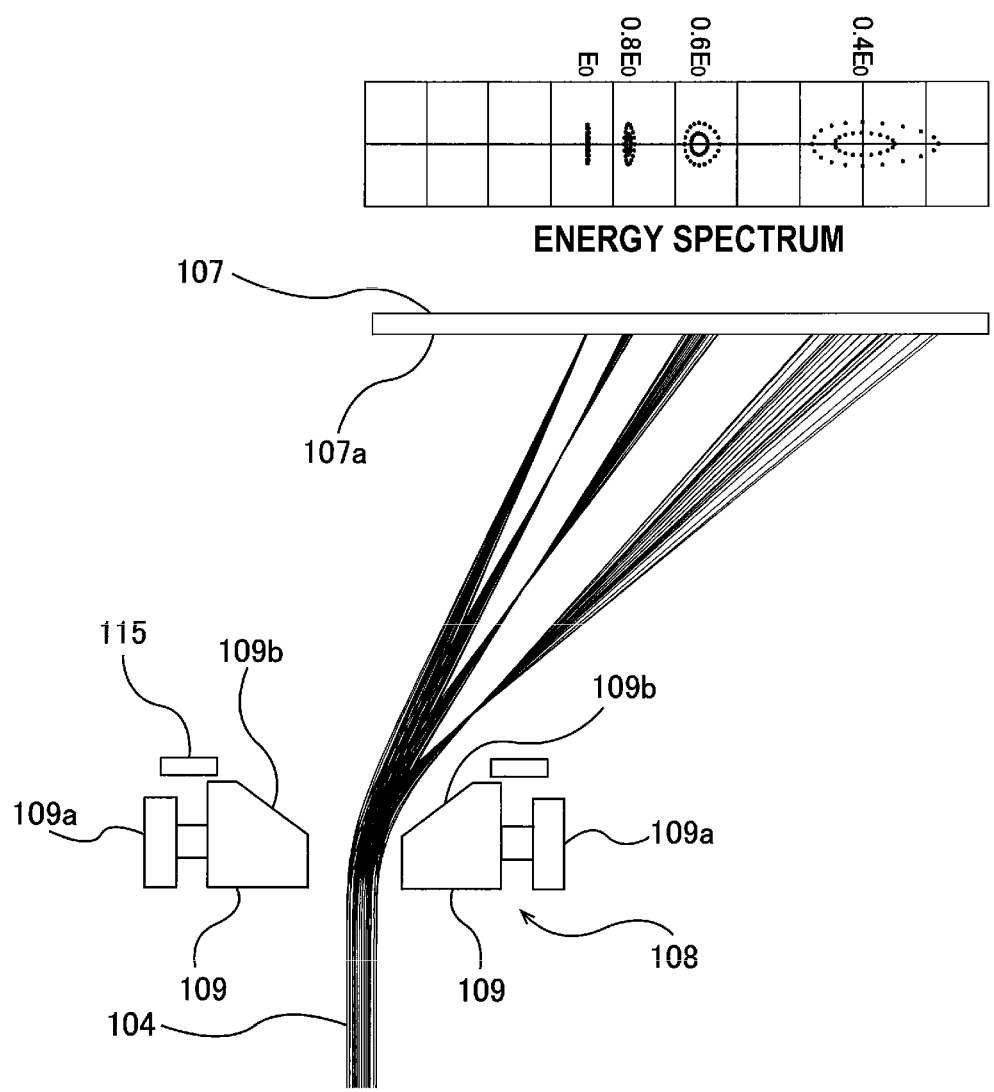
FIG. 6 is a diagram showing another example of a simulation result of an operation of the Wien filter.

The Wien filter 108 has the quadrupole-field component to satisfy the stigmatic condition. The quadrupole field of the Wien filter 108 has a function of moving the focal position of the beam in the x direction and the y direction independently. Therefore, by setting the intensity of the quadrupole field of the Wien filter 108 to a value different from that of the original stigmatic condition, the focal position of backscattered electrons having a certain specific energy can coincide with the detection surface 107a of the detector 107. FIG. 6 shows such an example, and shows a simulation result when the intensity of the quadrupole field is adjusted such that the focus condition on the detection surface 107a is satisfied at energy $E_0$.

Although the focus condition can be satisfied at an arbitrary energy by adjusting the intensity of the quadrupole field, the backscattered electrons cannot be focused on the detection surface 107a of the detector 107 over a wide energy range at the same time. Therefore, in the present embodiment, the intensity of the quadrupole field is changed with time, while a detecting position of the detector 107 is moved in synchronization with the change in intensity of the quadrupole field. This operation can achieve a high energy resolution in a wide energy range, and as a result, the best spectrum can be obtained. For example, the operation controller 150 instructs the Wien filter 108 to change the intensity of the quadrupole field to satisfy the focus condition shown in FIG. 5, while the operation controller 150 moves the detecting position of the detector 107 to a position of energy $0.6E_0$. As a result, the backscattered electrons are focused on the detection surface 107a of the detector 107 at the detecting position of the energy of $0.6E_0$. Similarly, the operation controller 150 instructs the Wien filter 108 to change the intensity of the quadrupole field to satisfy the focus condition shown in FIG. 6, while the operation controller 150 moves the detecting position of the detector 107 to a position of energy $E_0$. As a result, the backscattered electrons are focused on the detection surface 107a of the detector 107 at the detecting position of the energy of $E_0$.

In this manner, the operation controller 150 moves (sweeps) the detecting position of the detector 107 in synchronization with the change in the intensity of the quadrupole field, while changing (sweeping) the intensity of the quadrupole field. High energy resolution can be achieved over a wide energy range (e.g., a range of $E_0$ to $0.4E_0$). The relationship between the intensity of the quadrupole field and the corresponding detecting position of the detector 107 can be determined from a simulation of the operation of the Wien filter 108. According to this embodiment, the Wien filter 108 enables serial detection under high energy resolution.

In one embodiment, the detector 107 includes a scintillator that constitutes the detection surface 107a, a photodetector that includes an image sensor (for example, a CCD), and a light guide, such as an FOP (a fiber optic plate) which is configured to direct light, converted from electrons by the scintillator, to the photodetector. With this configuration, a position resolution of about 10 µm can be achieved. Moving of the detecting position of the detector 107 is achieved by changing signal output position of the photodetector.

When the intensity of the quadrupole field is changed, the quadrupole field deviates from the original stigmatic condition. Thus, an astigmatism correcting device 111 is provided in order to cancel the astigmatism of the primary electron beam caused by the change in the intensity of the quadrupole field. The astigmatism correcting device 111 is coupled to the operation controller 150, so that the operation controller 150 controls a correcting operation of the astigmatism correcting device 111 for canceling the astigmatism of the primary electron beam. More specifically, the operation controller 150 synchronizes a correction intensity of the astigmatism correcting device 111 with the change in the intensity of the quadrupole field such that the astigmatism correcting device 111 cancels the astigmatism of the primary electron beam caused by the change in the intensity of the quadrupole field. The astigmatism correcting device 111 is arranged between the electron gun 101 and the Wien filter 108. With this arrangement, the astigmatism correcting device 111 acts only on the primary electron beam and does not affect the backscattered electrons. Therefore, the astigmatism correcting device 111 can correct the astigmatism for the primary electron beam.

Generally, in many electron spectroscopy systems, a detector is arranged only at one place and a deflection intensity of a spectrometer is swept to obtain an energy spectrum. Even in the present case, the uniform field components $E_1$ and $B_1$ of the Wien filter are swept while satisfying the Wien condition, so that a spectrum can be obtained by a detector that is installed at a certain place. Moreover, by changing the quadrupole field in synchronism with the sweeping of the uniform field components $E_1$ and $B_1$, high energy resolution can be realized at all energies. However, it is not desirable to change the uniform field components $E_1$ and $B_1$ during a time period when the energy spectrum is being measured. This is because the Wien filter generally has phenomena of magnetic saturation and leakage of magnetic flux, and it is difficult to strictly maintain a balance condition for the primary electron beam under the control by voltage value and excitation value calculated in advance. Due to this effect, if the uniform field components $E_1$ and $B_1$ are changed, a phenomenon occurs in which a field of view on the specimen that is the target of energy analysis moves during the sweeping. In this embodiment, the uniform field components $E_1$ and $B_1$ of the Wien filter 108 are fixed during the sweeping of the intensity of the quadrupole field. Although the intensity of the quadrupole field changes during measuring of the energy spectrum, the quadrupole field has no effect of deflecting the primary electron beam. Therefore, the field of view can be strictly fixed during sweeping of the intensity of the quadrupole field without special control.

Figure 7:
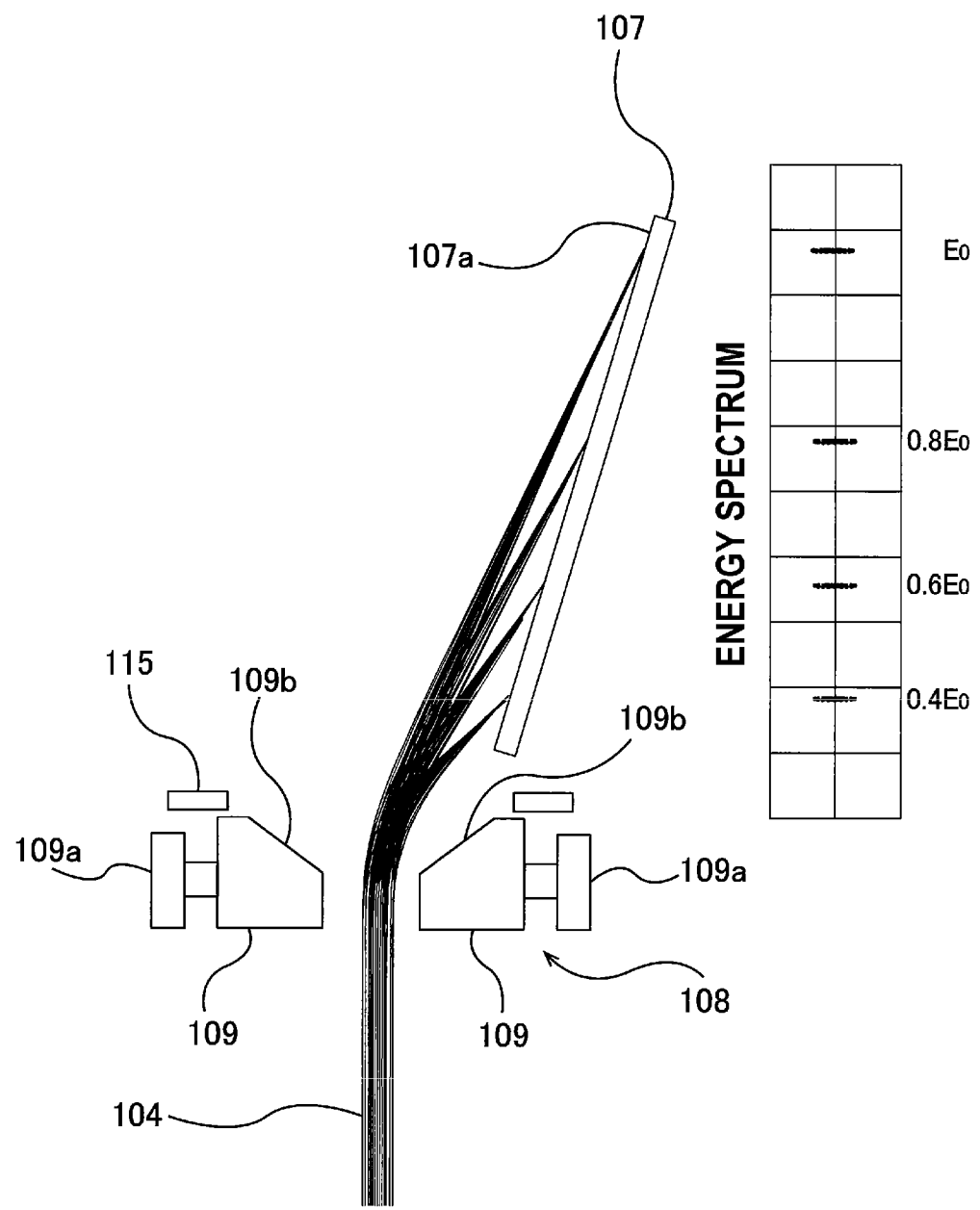
FIG. 7 is a diagram showing an embodiment of a detector having a detection surface arranged along a focal surface of dispersed backscattered electrons.

Next, another embodiment will be described. In FIG. 6, focal positions at the respective energies of the backscattered electrons, dispersed by the Wien filter 108, are arranged along a curved surface in a strict sense. This curved surface can be treated as approximately a flat surface. This phenomenon corresponds to a field curvature aberration of a normal axisymmetric lens. Therefore, when the detector 107 has the detection surface 107a that coincides with this curved surface or flat surface, the backscattered electrons can be simultaneously focused on the detection surface 107a of the detector 107 at all energy values without sweeping the intensity of the quadrupole field. As a result, the best energy resolution can be obtained. Therefore, as shown in FIG. 7, in one embodiment, the detector 107 has a detection surface 107a that substantially coincides with focal positions at respective energies in a predetermined energy range (for example, in a range from $E_0$ to $0.4E_0$). The detection surface 107a is composed of a curved surface or a flat surface. The detection surface 107a is arranged along a focus surface of the backscattered electrons, i.e., a surface including a plurality of focal positions of the backscattered electrons dispersed by the Wien filter 108. The focus surface of the backscattered electrons can be determined from a simulation of the operation of the Wien filter 108.

In the embodiment shown in FIG. 7, the quadrupole field of the Wien filter 108 is out of the stigmatic condition. Therefore, it is necessary to cancel the astigmatism of the primary electron beam by the astigmatism correcting device 111. In this embodiment, since the intensity of the quadrupole field is fixed, it is not necessary to change the correction intensity of the astigmatism correcting device 111 during the measurement of the energy spectrum.

The detection surface 107a of the detector 107 is inclined with respect to the optical axis. An angle of the detection surface 107a, which is a flat surface in one embodiment, from the optical axis depends on the shapes of the Wien filter 108 and the shunt 115, a spread angle of the backscattered electrons entering the Wien filter 108, and the energy range to be analyzed. As a typical value, the angle of the detection surface 107a from the optical axis is about $10°\pm5°$. This angle is uniquely determined once the above parameters, such as the shape of the Wien filter 108, are determined.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention can be applicable to an apparatus and a method for analyzing the energy of backscattered electrons generated from a specimen.

REFERENCE SIGNS LIST 101 electron gun
102 condenser lens system
103 primary electron beam
104 backscattered electron beam
105 objective lens
106 specimen
107 detector
108 Wien filter
109 pole
109a coil
109b tapered surface
110 backscattered electron diaphragm
112 deflector
115 shunt
116 slit
117 through-hole
121 imaging device
150 operation controller

The invention claimed is:

1. An apparatus comprising:
an electron beam source configured to generate a primary electron beam;
an electron optical system configured to direct the primary electron beam to a specimen while focusing and deflecting the primary electron beam; and
an energy analyzing system configured to detect an energy spectrum of backscattered electrons emitted from the specimen,
the energy analyzing system including:
a Wien filter configured to disperse the backscattered electrons;
a detector configured to measure the energy spectrum of the backscattered electrons dispersed by the Wien filter; and
an operation controller comprising instructions configured to change an intensity of a quadrupole field of the Wien filter, while moving a detecting position of the detector for the backscattered electrons in synchronization with the change in the intensity of the quadrupole field.

2. The apparatus according to claim 1, wherein the operation controller is configured to change the intensity of the quadrupole field of the Wien filter, while moving the detecting position of the detector for the backscattered electrons in synchronization with the change in the intensity of the quadrupole field such that the backscattered electrons are focused on the detecting position.

3. An apparatus comprising:
an electron beam source configured to generate a primary electron beam;
an electron optical system configured to direct the primary electron beam to a specimen while focusing and deflecting the primary electron beam; and
an energy analyzing system configured to detect an energy spectrum of backscattered electrons emitted from the specimen,
the energy analyzing system including:
a Wien filter configured to disperse the backscattered electrons;
a detector configured to measure the energy spectrum of the backscattered electrons dispersed by the Wien filter;
an operation controller configured to change an intensity of a quadrupole field of the Wien filter, while moving a detecting position of the detector for the backscattered electrons in synchronization with the change in the intensity of the quadrupole field; and
an astigmatism correcting device arranged between the electron beam source and the Wien filter, the astigmatism correcting device being configured to cancel astigmatism of the primary electron beam in synchronization with the change in the intensity of the quadrupole field.

4. The apparatus, comprising:
an electron beam source configured to generate a primary electron beam;
an electron optical system configured to direct the primary electron beam to a specimen while focusing and deflecting the primary electron beam; and
an energy analyzing system configured to detect an energy spectrum of backscattered electrons emitted from the specimen,
the energy analyzing system including:
a Wien filter configured to disperse the backscattered electrons;
a detector configured to measure the energy spectrum of the backscattered electrons dispersed by the Wien filter;
an operation controller configured to change an intensity of a quadrupole field of the Wien filter,
while moving a detecting position of the detector for the backscattered electrons in synchronization with the change in the intensity of the quadrupole field; and
a shunt arranged at an outlet side of the Wien filter, the shunt having a slit extending in a direction in which the backscattered electrons are dispersed.

5. An apparatus comprising:
an electron beam source configured to generate a primary electron beam;
an electron optical system configured to direct the primary electron beam to a specimen while focusing and deflecting the primary electron beam; and
an energy analyzing system configured to detect an energy spectrum of backscattered electrons emitted from the specimen,
the energy analyzing system including:
a Wien filter configured to disperse the backscattered electrons; and
a detector configured to measure the energy spectrum of the backscattered electrons dispersed by the Wien filter, the detector having a detection surface that substantially coincides with focal positions at respective energies of the backscattered electrons dispersed by the Wien filter, the detection surface of the detector comprises a flat surface, and an angle of the detection surface from an optical axis is in a range of $10°±5°$.

6. The apparatus according to claim 5, wherein the energy analyzing system further includes an astigmatism correcting device arranged between the electron beam source and the Wien filter.

7. The apparatus according to claim 5, wherein the energy analyzing system further includes a shunt arranged at an outlet side of the Wien filter, the shunt having a slit extending in a direction in which the backscattered electrons are dispersed.

8. A method comprising:
directing a primary electron beam, generated by an electron beam source, to a specimen;
dispersing backscattered electrons, emitted from the specimen, by a Wien filter;
measuring an energy spectrum of the dispersed backscattered electrons by a detector; and
during measuring of the energy spectrum, changing an intensity of a quadrupole field of the Wien filter, while moving a detecting position of the detector for the backscattered electrons in synchronization with the change in the intensity of the quadrupole field.

9. The method according to claim 8, wherein changing the intensity of quadrupole field of the Wien filter, while moving the detecting position of the detector for the backscattered electrons in synchronization with the change in the intensity of the quadrupole field comprises, during measuring of the energy spectrum, changing the intensity of the quadrupole field of the Wien filter, while moving the detecting position of the detector for the backscattered electrons in synchronization with the change in the intensity of the quadrupole field such that the backscattered electrons are focused on the detecting position.

10. The method according to claim 8, further comprising:
cancelling astigmatism of the primary electron beam in synchronization with the change in the intensity of the quadrupole field.

11. A method comprising:
   directing a primary electron beam, generated by an electron beam source, to a specimen;
   dispersing backscattered electrons, emitted from the specimen, by a Wien filter; and
   measuring an energy spectrum of the dispersed backscattered electrons by a detector, the detector having a detection surface that substantially coincides with focal positions at respective energies of the backscattered electrons dispersed by the Wien filter, the detection surface of the detector comprising a flat surface, and an angle of the detection surface from an optical axis is in a range of $10°\pm5°$.

* * * * *